US011863225B2

(12) United States Patent
Menkhoff et al.

(10) Patent No.: US 11,863,225 B2
(45) Date of Patent: Jan. 2, 2024

(54) ELECTRONIC DEVICES HAVING QUADRATIC PHASE GENERATION CIRCUITRY

(71) Applicant: Apple Inc., Cupertino, CA (US)

(72) Inventors: Andreas Menkhoff, Oberhaching (DE); Andreas Boehme, Munich (DE); Bernhard Sogl, Unterhaching (DE); Jochen Schrattenecker, Alberndorf in der Riedmark (AT); Joonhoi Hur, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 39 days.

(21) Appl. No.: 17/468,482

(22) Filed: Sep. 7, 2021

(65) Prior Publication Data
US 2023/0075465 A1    Mar. 9, 2023

(51) Int. Cl.
*H04B 1/40*    (2015.01)
*H03K 5/01*    (2006.01)
*H03K 5/00*    (2006.01)

(52) U.S. Cl.
CPC ............... *H04B 1/40* (2013.01); *H03K 5/01* (2013.01); *H03K 2005/00013* (2013.01)

(58) Field of Classification Search
CPC ......... H04J 13/0059; H04B 1/40; H03K 5/01; G01S 13/34; G01S 13/341
See application file for complete search history.

(56) References Cited

U.S. PATENT DOCUMENTS

| 6,765,517 B1* | 7/2004 | Ali ..................... H03M 3/394 341/120 |
| 7,539,263 B2 | 5/2009 | Jung et al. |
| 8,090,057 B2 | 1/2012 | Min et al. |
| 9,614,635 B2 | 4/2017 | Razmtouz |
| 2010/0272022 A1 | 10/2010 | Iwai et al. |
| 2011/0002321 A1 | 1/2011 | Iwai et al. |

FOREIGN PATENT DOCUMENTS

| CN | 112292612 A | 1/2021 |
| CN | 113009429 A | 6/2021 |
| WO | 2020150283 A1 | 7/2020 |

* cited by examiner

*Primary Examiner* — Patrick C Chen
(74) *Attorney, Agent, or Firm* — TREYZ LAW GROUP; Jason Tsai

(57) ABSTRACT

An electronic device may include wireless circuitry. The wireless circuitry may include a quadratic phase generator for outputting a perfectly interpolated constant amplitude zero autocorrelation (CAZAC) sequence for a transmit path. The quadratic phase generator may include a numerically controlled oscillator, a switch controlled based on a value output from the numerically controlled oscillator, a first integrator stage, and a second integrator stage connected in series with the first integrator stage. The numerically controlled oscillator may receive as inputs a chirp count and a word length. The switch may be configured to switchably feed one of two input values that are a function of the chirp count and the word length to the first integrator stage. The quadratic phase generator may output full-bandwidth chirps or reduced-bandwidth chirps. Bandwidth reduction can be achieved by scaling the two input values of the switches.

19 Claims, 12 Drawing Sheets

ELECTRONIC DEVICES HAVING QUADRATIC PHASE GENERATION CIRCUITRY

FIELD

This disclosure relates generally to electronic devices and, more particularly, to electronic devices with wireless circuitry.

BACKGROUND

Electronic devices are often provided with wireless capabilities. An electronic device with wireless capabilities has wireless circuitry that includes one or more antennas. The wireless circuitry is sometimes used to perform spatial ranging operations in which radio-frequency signals are used to estimate a distance between the electronic device and an external object. It can be challenging to design wireless circuitry that accurately estimates this distance. To perform spatial ranging operations, the wireless circuitry sometimes generates a constant amplitude zero auto correlation (CAZAC) sequence such as the Zadoff-Chu sequence. Conventional generation of Zadoff-Chu sequences, however, can still produce results with quantization errors and thus inaccuracies in the estimated distance.

SUMMARY

An electronic device may include wireless circuitry. The wireless circuitry may include spatial ranging circuitry and antennas. In one implementation that is described herein as an example, the spatial ranging circuitry includes radar circuitry such as frequency modulated continuous wave (FMCW) radar circuitry. The radar circuitry may include a quadratic phase generator in the transmit path. The quadratic phase generator may output an interpolated constant amplitude zero autocorrelation (CAZAC) sequence, which can be fed through one or more digital-to-analog converters (DACs) to produce analog signals that are eventually transmitted by an antenna. The CAZAC sequence must be interpolated since the digital-to-analog converter has a finite bandwidth and the band edges are always disturbed (e.g., by anti-aliasing circuitry). The quadratic phase generator may include a switch, a numerically controlled oscillator for controlling the switch, a first integrator stage configured to receive signals from the switch, and a second integrator stage connected in series with the first integrator stage. The switch may output a first value that is proportional to a chirp count q to the first integrator stage when the numerically controlled oscillator outputs a value less than or equal to a threshold level. The switch may alternatively output a second value that is proportional to a difference of the chirp count q and a word length M when the numerically controlled oscillator outputs a value exceeding the threshold level. The amount of interpolation of the CAZAC sequence can be adjusted using a weighting factor b. Thus, with a fixed DAC sampling frequency, a chirp with variable bandwidth can be transmitted. An interpolated CAZAC sequence generated in this way exhibits q chirps each with a distinct quadratic phase response, which translates to a linear instantaneous frequency response with no frequency outliers between chirps.

An aspect of the disclosure provides wireless circuitry that includes at least one digital-to-analog converter having an input and an output that is coupled to an antenna and a quadratic phase generator having an output port coupled to the input of the at least one digital-to-analog converter, a first integrator stage having an input and an output, a second integrator stage having an input coupled to the output of the first integrator stage and having an output connected to the output port, and a switch having a first input, a second input, and an output that is coupled to the input of the first integrator stage. The quadratic phase generator can be configured to output a constant amplitude zero autocorrelation (CAZAC) sequence at the output port. The CAZAC sequence is perfectly interpolated in almost all practical applications and is thus sometimes referred to as an interpolated CAZAC sequence. The first input of the switch can receive a first value that is a function of a chirp count q that defines a number of chirps in the CAZAC sequence. The second input of the switch can receive a second value that is a function of the chirp count q and a word length M that defines a number of samples in the CAZAC sequence. The first and second values can optionally be multiplied by a scaling factor b to reduce the bandwidth of the quadratic phase generator. The quadratic phase generator can include a numerically controlled oscillator for controlling the switch, the switch being configured to connect its first input to its output when a value output by the numerically controlled oscillator is less than or equal to a threshold value, and to connect its second input to its output when the value output by the numerically controlled oscillator is greater than the threshold value.

An aspect of the disclosure provides a method for operating wireless circuitry. The method can include receiving digital signals at a digital-to-analog converter and converting the digital signals to analog signals for transmission via an antenna, and outputting an interpolated constant amplitude zero autocorrelation (CAZAC) sequence from a quadratic phase generator. The digital signals received at the digital-to-analog converter can be generated based on the interpolated CAZAC sequence output from the quadratic phase generator. Operating the quadratic phase generator can involve controlling a switch to selectively output a first value and a second value to a first integrator stage, receiving signals from the first integrator stage at a second integrator stage, and outputting the interpolated CAZAC sequence from the second integrator stage.

The method can further include controlling the switch based on a value output from a numerically controlled oscillator, periodically incrementing the value output from the numerically controlled oscillator, and determining whether the value output from the numerically controlled oscillator exceeds a threshold value. In response to determining that the value output from the numerically controlled oscillator does not exceed the threshold value, the switch can output the first value to the first integrator stage. In response to determining that the value output from the numerically controlled oscillator exceeds the threshold value, the switch can output the second value to the first integrator stage, where the second value is less than the first value.

An aspect of the disclosure provides an electronic device that includes a baseband transmitter having a quadratic phase generator configured to output an interpolated constant amplitude zero autocorrelation (CAZAC) sequence, a digital-to-analog converter having an input configured to receive signals generated based on the interpolated CAZAC sequence and an output coupled to a first antenna, a first channel filter interposed between the baseband transmitter and the input of the digital-to-analog converter, an analog-to-digital converter having an input coupled to a second antenna and having an output on which digital signals are generated, a baseband receiver having an input configured to receive signals generated based on the digital signals output from the analog-to-digital converter, and a second channel filter interposed between the output of the analog-to-digital converter and the input of the baseband receiver. The first and second channel filters can have the same bandwidth as the quadratic phase generator. The electronic device can further include an offset correction circuit interposed between the output of the analog-to-digital converter and the second channel filter, and a delay compensation circuit coupled between the baseband transmitter and the baseband receiver.

DETAILED DESCRIPTION

Figure 1:
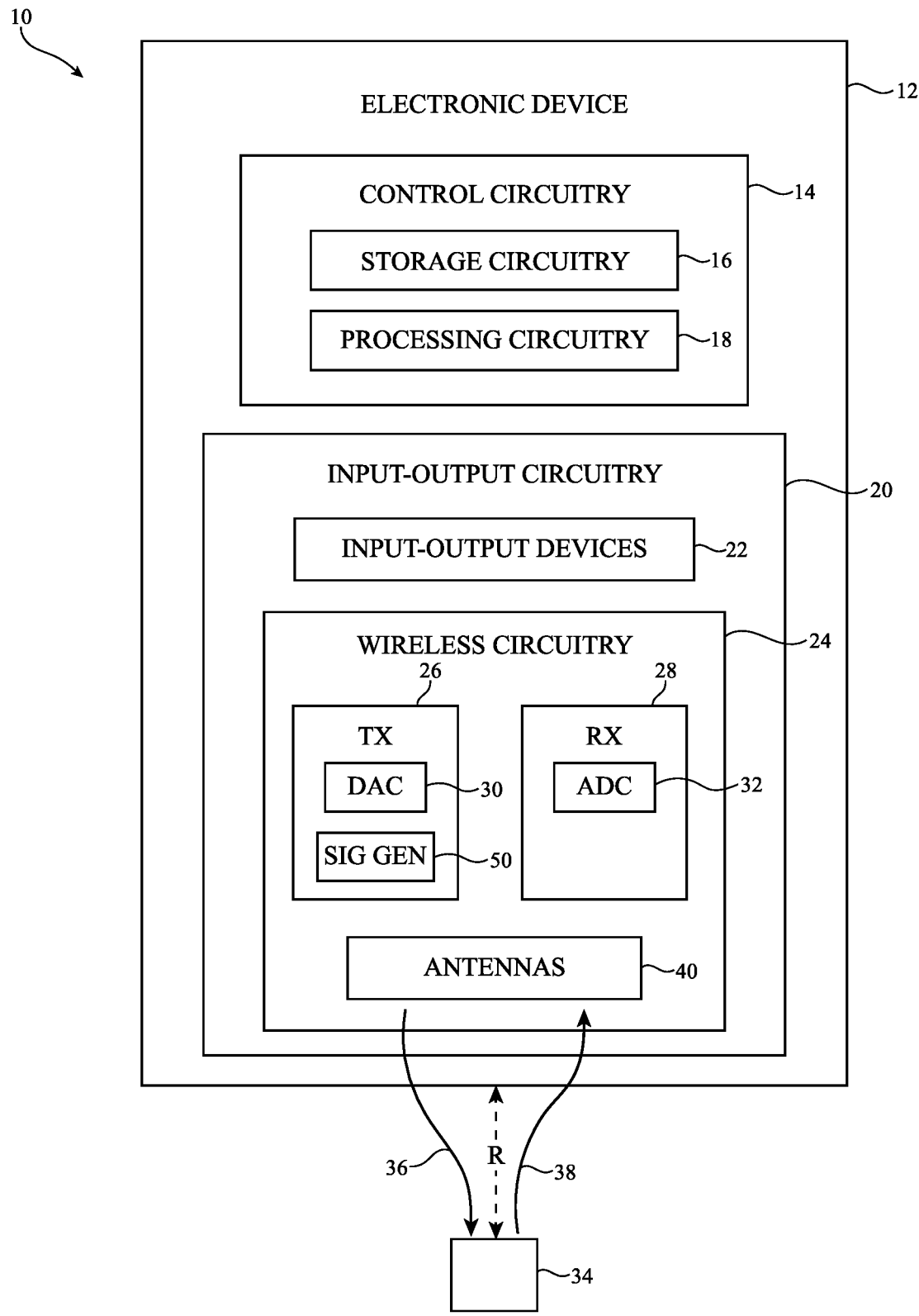
FIG. 1 is a functional block diagram of an illustrative electronic device having wireless circuitry in accordance with some embodiments.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as an outer casing, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include two or more antennas 40. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using antennas 40.

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Antennas 40 may be formed using any desired antenna structures. For example, antennas 40 may include antennas with resonating elements that are formed from loop antenna structures, patch antenna structures, inverted-F antenna structures, slot antenna structures, planar inverted-F antenna structures, helical antenna structures, monopole antennas, dipoles, hybrids of these designs, etc. Filter circuitry, switching circuitry, impedance matching circuitry, and/or other antenna tuning components may be adjusted to adjust the frequency response and wireless performance of antennas 40 over time.

The radio-frequency signals handled by antennas 40 may be used to convey wireless communications data between device 10 and external wireless communications equipment (e.g., one or more other devices such as device 10). Wireless communications data may be conveyed by wireless circuitry 24 bidirectionally or unidirectionally. The wireless communications data may, for example, include data that has been encoded into corresponding data packets such as wireless data associated with a telephone call, streaming media content, internet browsing, wireless data associated with software applications running on device 10, email messages, etc.

Wireless circuitry 24 may additionally or alternatively perform spatial ranging operations using antennas 40. In scenarios where wireless circuitry 24 both conveys wireless communications data and performs spatial ranging operations, one or more of the same antennas 40 may be used to both convey wireless communications data and perform spatial ranging operations. In another implementation, wireless circuitry 24 may include a set of antennas 40 that only conveys wireless communications data and a set of antennas 40 that is only used to perform spatial ranging operations.

When performing spatial ranging operations, antennas 40 may transmit radio-frequency signals 36. Wireless circuitry 24 may transmit radio-frequency signals 36 in a corresponding radio-frequency band (e.g., a frequency band that includes frequencies greater than around 10 GHz, greater than around 20 GHz, less than 10 GHz, etc.). Radio-frequency signals 36 may reflect off of objects external to device 10 such as external object 34. External object 34 may be, for example, the ground, a building, a wall, furniture, a ceiling, a person, a body part, an animal, a vehicle, a landscape or geographic feature, an obstacle, or any other object or entity that is external to device 10. Antennas 40 may receive reflected radio-frequency signals 38. Reflected signals 38 may be a reflected version of the transmitted radio-frequency signals 36 that have reflected off of external object 34 and travel back towards device 10.

Control circuitry 14 may process the transmitted radio-frequency signals 36 and the received reflected signals 38 to detect or estimate the range (distance) R between device 10 and external object 34. If desired, control circuitry 14 may also process the transmitted and received signals to identify a two or three-dimensional spatial location (position) of external object 34, a velocity of external object 34, and/or an angle of arrival of reflected signals 38. In one implementation that is described herein as an example, wireless circuitry 24 performs spatial ranging operations using a frequency-modulated continuous-wave (FMCW) radar scheme. This is merely illustrative and, in general, other radar schemes or spatial ranging schemes may be used (e.g., an OFDM radar scheme, an FSCW radar scheme, a phase coded radar scheme, etc.).

As shown in FIG. 1, wireless circuitry 24 may include transmit (TX) circuitry 26. Transmit circuitry 26 may include a transmit signal generator such as signal generator 50. Transmit signal generator 50 may generate signals for transmission over antenna(s) 40. In some implementations that are described herein as an example, transmit signal generator 50 includes a chirp generator that generates chirp signals for transmission over antenna(s) 40 (e.g., in embodiments where wireless circuitry 24 uses an FMCW radar scheme). Transmit signal generator 50 may therefore sometimes be referred to herein as a chirp generator. Transmit circuitry 26 may also include a digital-to-analog converter (DAC) circuit such as DAC 30. Digital-to-analog converter 30 may convert the transmit signals (e.g., the chirp signals) from the digital domain to the analog domain prior to transmission by antennas 40.

Wireless circuitry 24 may also include receive (RX) circuitry 28. Receive circuitry 28 may include an analog-to-digital converter (ADC) circuit such as ADC 32. Analog-to-digital converter 32 may convert radio-frequency signals received from antennas 40 from the analog domain to the digital domain for subsequent processing by control circuitry 14. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). For example, wireless circuitry 24 includes a baseband processor that can be considered part of processing circuitry 18.

Figure 2:
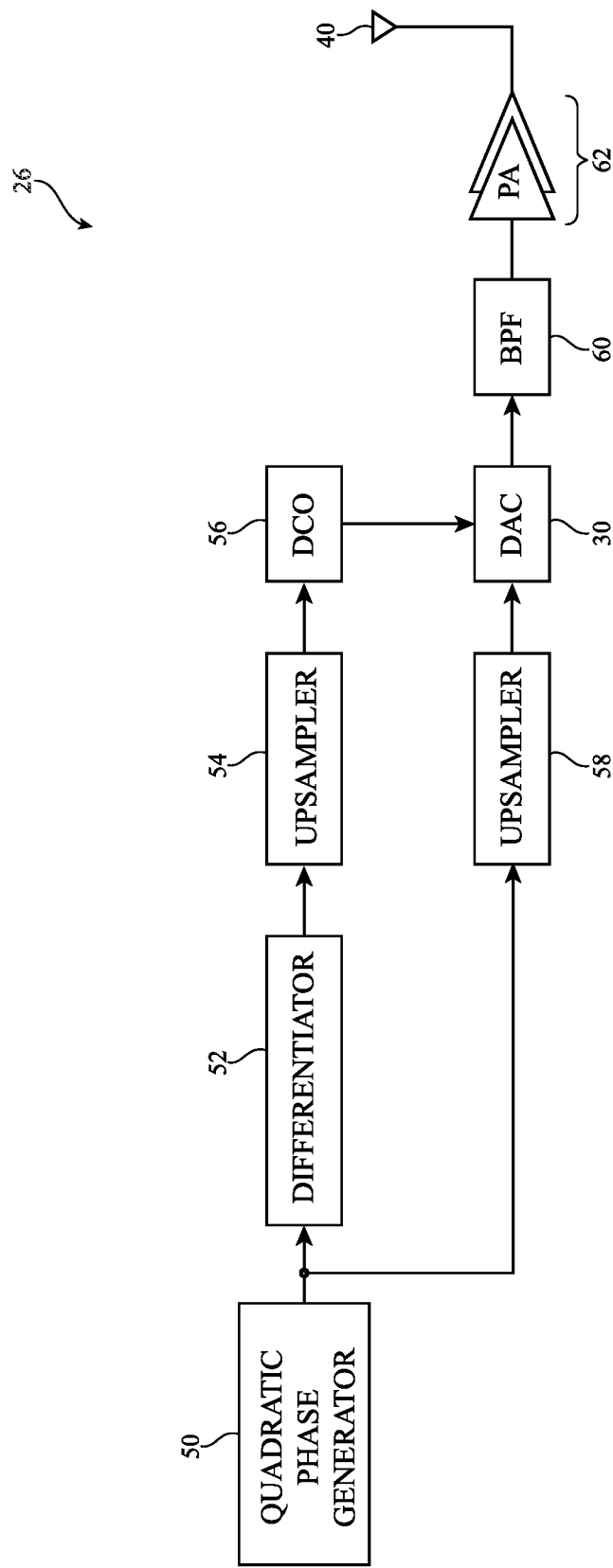
FIG. 2 is a circuit diagram of illustrative digital polar transmitter circuitry having a quadratic phase generator in accordance with some embodiments.

Transmit circuitry 26 can be implemented using a variety of different radio-frequency transmitter architectures. FIG. 2 illustrates circuitry 26 implemented as a digital polar transmitter. As shown in FIG. 2, digital polar transmitter circuitry 26 may include a transmit signal generator 50 configured to output transmit signals, a differentiator 52 configured to differentiate or compute the derivative of the transmit signal with respect to time, upsampling circuits 54 and 58, an oscillation circuit such as digitally controlled oscillator 56, a data converter such as digital-to-analog converter (DAC) 30, a filtering circuit such as bandpass filter 60, and one or more power amplifiers 62.

In accordance with some embodiments, transmit signal generator 50 may be configured to generate constant amplitude zero autocorrelation (CAZAC) sequences. As its name suggests, a CAZAC sequence has two identifying properties. The first property of any CAZAC sequence is that the sequence has constant amplitude. In other words, the numbers in a CAZAC sequence will all lie along a circle when plotted on a complex plane. The second property of any CAZAC sequence is that the correlation of a given sequence and a shifted version of that given sequence will be approximately equal to zero. In other words, the two sequences are orthogonal. Generating orthogonal sequences having constant amplitude can be useful in radar and many wireless applications. In order to enable high quality transmission, it may be preferable to generate an interpolated CAZAC sequence using the transmit signal generator 50.

One way of generating a CAZAC sequence is to use a signal generator that can output a signal with quadratic phase. Such type of CAZAC sequence generator is sometimes referred to as a quadratic phase generator. Transmit signal generator 50 of FIG. 2 may be a quadratic phase generator capable of outputting one or more CAZAC sequences. Signals output from quadratic phase generator 50 may be fed to digital-to-analog converter 30 via upsampling circuit 58. Upsampling circuit 58 may perform up-sampling or up-conversion operations. Signals output from quadratic phase generator 50 may also be fed to digitally controlled oscillator 56 via differentiator 52 and upsampling circuit 54. Differentiator 52 may be configured to compute the derivative of a signal with a quadratic phase waveform with respect to time, which yields an instantaneous frequency that is linear as a function of time. As a result, signal generator 50 is also sometimes referred to as a linear frequency generator or linear instantaneous frequency generator. This linear instantaneous frequency can be up up-sampled or up-converted by upsampling circuit 54 before being received by digitally controlled oscillator 56. Digitally controlled oscillator 56 may have an output that is coupled to a control input of digital-to-analog converter 30.

Digital-to-analog converter 30 may output a corresponding analog signal that can be filtered using bandpass filter 60. The filtered signals can then be amplified by one or more power amplifiers 62 before be radiated by antenna(s) 40. This example in which at least an upsampling circuit, a digital-to-analog converter, a bandpass filter, and power amplifiers are included in the transmit path is merely illustrative. If desired, transmitter circuitry 26 may include additional digital components coupled to or inserted before DAC 30, fewer digital components, additional analog front-end components coupled to or inserted after DAC 30, fewer analog front-end components, and/or additional filter, switching, or coupling circuitry. Since the DAC has a finite bandwidth and the band edges are almost always disturbed (e.g., by associated anti-aliasing circuitry), the CAZAC sequence generated by quadratic phase generator 50 should be perfectly interpolated in almost all practical applications.

Figure 3:
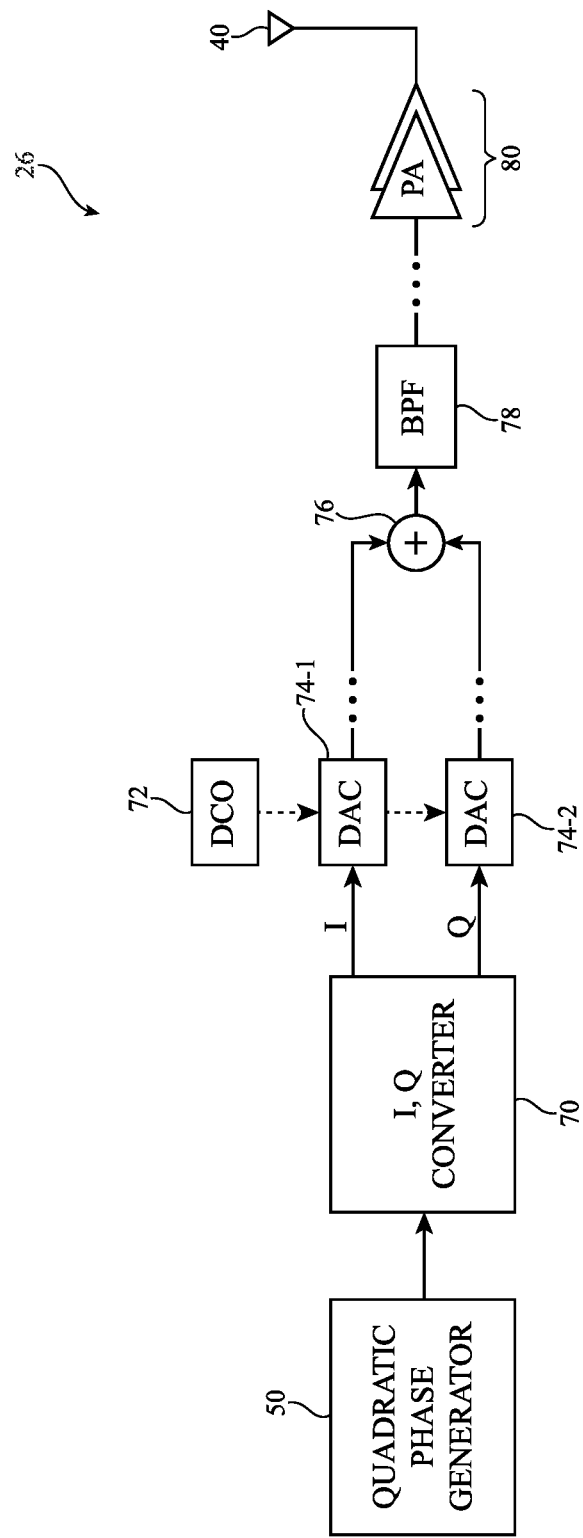
FIG. 3 is a circuit diagram of illustrative IQ transmitter circuitry having a quadratic phase generator in accordance with some embodiments.

The digital polar transmitter architecture of FIG. 2 is merely illustrative. FIG. 3 illustrates circuitry 26 implemented as an IQ transmitter. As shown in FIG. 3, IQ transmitter circuitry 26 may include a quadric phase generator 50 configured to output signals having a quadratic phase, an IQ conversion circuit such as IQ converter 70 configured to output in-phase (I) signals and quadrature (Q) signals, a first digital-to-analog converter (DAC) 74-1 configured to convert the in-phase signals to the analog domain, a second digital-to-analog converter (DAC) 74-2 configured to convert the quadrature signals to the analog domain, a digitally controlled oscillator 72 for controlling the two DACs 74-1 and 74-2, a summing circuit such as combiner 76, a filtering circuit such as bandpass filter 78, and one or more power amplifiers 80. DACs 74-1 and 74-2 may be represented collectively by block 30 in FIG. 1.

In some embodiments, upsampling circuits may be interposed between IQ converter 70 and DACs 74-1 and 74-2. In such scenarios, the additional upsampling circuits may be configured to up-sample or up-convert the IQ signals prior to the digital-to-analog conversion step. In yet other embodiments, filtering circuits such as low pass filters can be interposed between the DACs and combiner 76. If desired, additional mixers may be interposed between the DACs and combiner 76. These additional mixers may, for example, be used to modulate the analog signals to an intermediate frequency range that is between the baseband frequency and the transmitting radio frequency. In such scenarios, yet another set of mixers may be interposed between bandpass filter 78 and the power amplifiers and are used to further modulate the analog signals from the intermediate frequency range to the transmitting radio frequency.

The example of FIG. 3 in which at least an IQ converter, multiple DACs, a DCO, a summing circuit, a bandpass filter, and power amplifiers are included in the transmit path is merely illustrative. If desired, IQ transmitter circuitry 26 may include additional digital components coupled to or inserted before DACs 74, fewer digital components, additional analog front-end components coupled to or inserted after DACs 74, fewer analog front-end components, and/or additional filter, switching, or radio-frequency coupling circuitry. In general, quadratic phase generator 50 can be incorporated into any radar, analog front-end, or wireless communications architecture.

Figure 4:
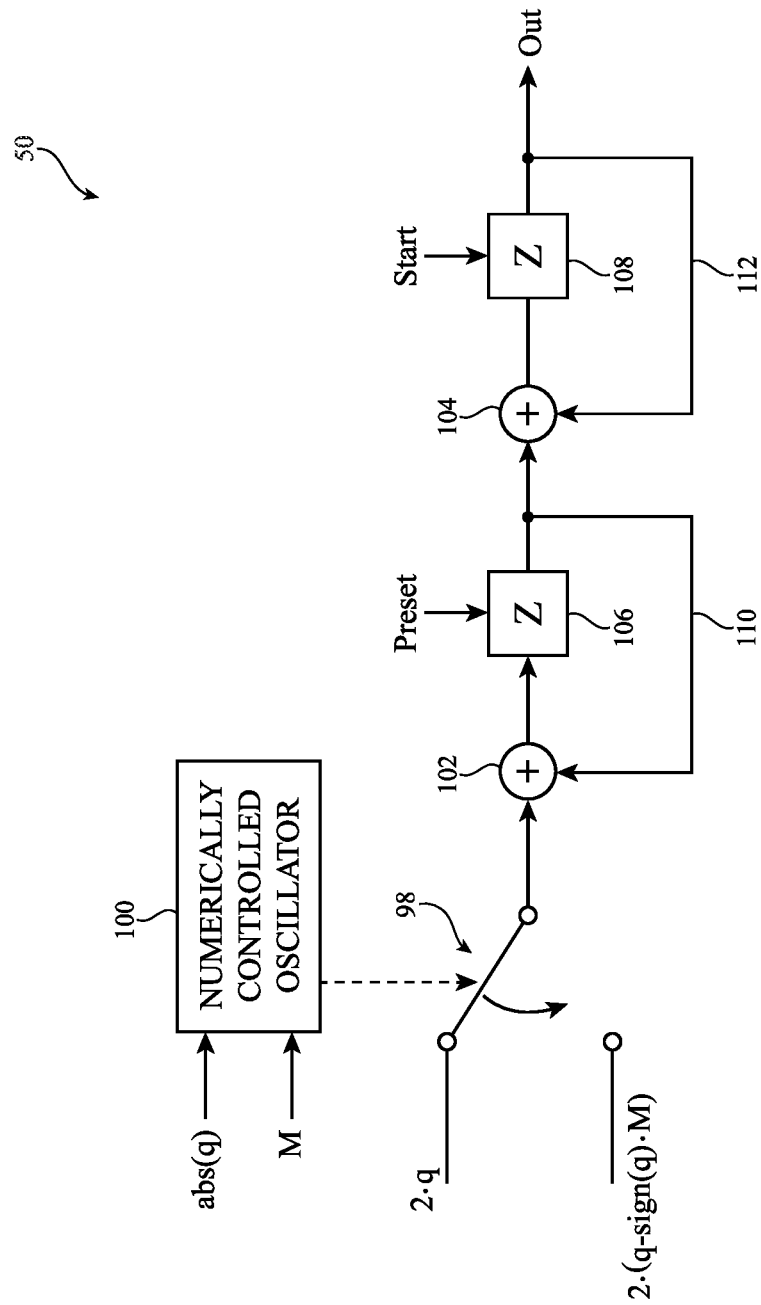
FIG. 4 is a block diagram of an illustrative full-bandwidth quadratic phase generator in accordance with some embodiments.

FIG. 4 is a block diagram showing one implementation of quadratic phase generator 50. As shown in FIG. 4, quadratic phase generator 50 may include a switch such as switch 98, a control circuit such as numerically controlled oscillator (NCO) 100, adder circuits such as adders 102 and 104, and delay circuits such as delay circuits 106 and 108.

Quadratic phase generator 50 is generally a function of two inputs: (1) a chirp count q and (2) word length M. The chirp count q represents the total number of chirps in each sequence. Word length M represents the number of elements being sampled as a function of time for each CAZAC sequence (e.g., M is equal to the number of samples per sequence). In general, chirp count q can be any positive or negative integer such as ±3, ±4, ±5, ±6, ±7, ±8, ±9, ±(10 to 100), or more. The value of word length M should be an integer such that the greatest common divisor of q and M is equal to one. In general, word length M is at least greater than 10, 10-100, at least 100 or more, 100-200, at least 200 or more, etc. These values are merely exemplary and are not intended to limit the scope of the present embodiments.

Numerically controlled oscillator (NCO) 100 may have a first input configured to receive an absolute value of chirp count q, a second input configured to receive word length M, and an output coupled to switch 98. Oscillator 100 may output an integrator value on its output that determines the state of switch 98. Switch 98 may have a first switch input port configured to receive two times chirp count q, a second switch input port configured to receive two times the quantity of chirp count q minus the product of the sign of chirp count q and word length M, and a switch output port. When numerically controlled oscillator 100 outputs an integrator value that is less than or equal to a threshold value, then switch 98 may connect the first switch input port to the switch output port (e.g., such that adder 102 receives 2*q). When numerically controlled oscillator 100 outputs an integrator value that is greater than the threshold value, then switch 98 may connect the second switch input port to the switch output port (e.g., such that adder 102 receives 2*(q−sign(q)*M). The predetermined threshold value can be equal to M (as an example). The threshold value can be a fixed number or can be programmable.

Adder 102 may have a first adder input coupled to the switch output port, a second adder input, and an adder output. Delay circuit 106 may have a first input coupled to the adder output of adder 102, a second input configured to receive a preset signal, and an output that is fed back to the second adder input of adder 102 via feedback path 110. The preset signal can help reset (initialize) delay circuit 106 to some predetermined (preset) value. Coupled in this way, adder 102, delay circuit 106, and feedback path 110 can operate as a first integrator (accumulator) stage.

Adder 104 may have a first adder input coupled to the output of delay circuit 106, a second adder input, and an adder output. Delay circuit 108 may have a first input coupled to the adder output of adder 104, a second input configured to receive a start signal, and an output that is fed back to the second adder input of adder 104 via feedback path 112. The start signal can help reset (initialize) delay circuit 106 to zero (as an example). Coupled in this way, adder 104, delay circuit 108, and feedback path 112 can operate as a second integrator (accumulator) stage. The output of delay circuit 108 is coupled to the final output port Out of quadratic phase generator 50, on which a signal with quadratic phase is generated. In general, the preset and start signals can be set to any suitable value for initializing or resetting quadratic phase generator 50.

Configured as such, quadratic phase generator 50 of FIG. 4 is thus able to sum up during one symbol M samples with two instantaneous frequency increments as shown in equation 1 below:

$$\sum_{m=1}^{|q|}(|q|-M) + \sum_{m=|q|+1}^{M}|q| = 0 \qquad (1)$$

A weighted sum of zero ensures that quadratic phase generator 50 produces minimal quantization error.

Figures 5A, 5B, 5C:
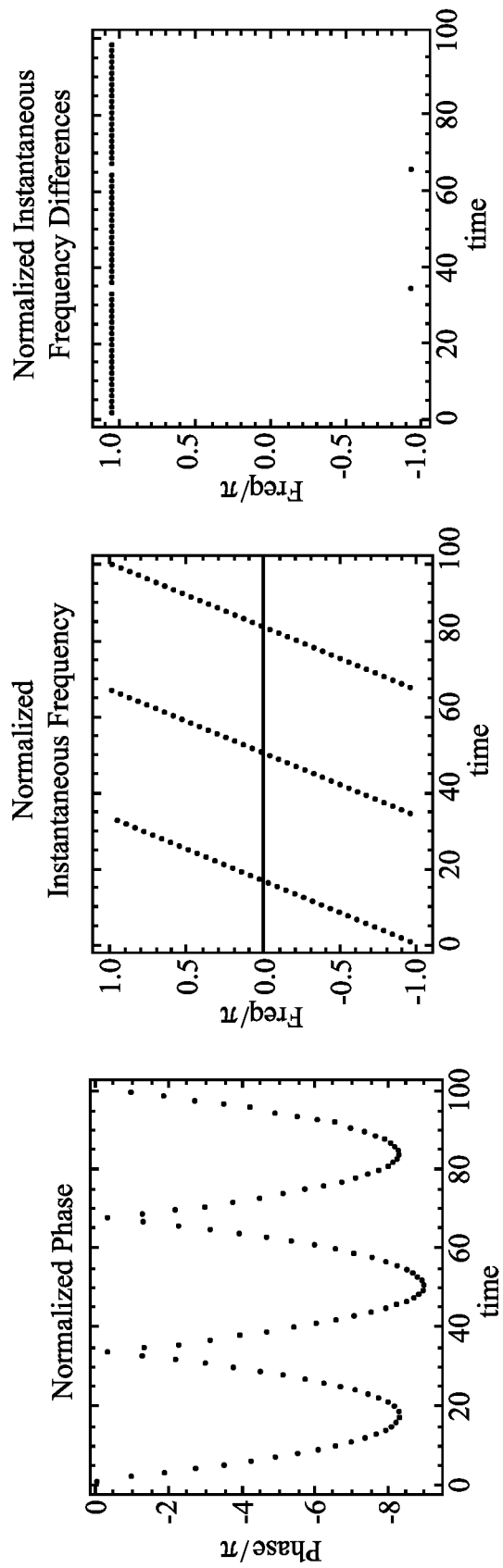
FIG. 5A is a diagram plotting output phase for the full-bandwidth quadratic phase generator of FIG. 4 in accordance with some embodiments.
FIG. 5B is a diagram plotting instantaneous frequency for the full-bandwidth quadratic phase generator of FIG. 4 in accordance with some embodiments.
FIG. 5C is a diagram plotting instantaneous frequency differences for the full-bandwidth quadratic phase generator of FIG. 4 in accordance with some embodiments.

FIG. 5A is a diagram plotting the output phase for a quadratic phase generator 50 of the type described in connection with FIG. 4 for one sequence, where chirp count q is equal to 3 and where word length M is equal to 100. The output phase is normalized (i.e., divided) by a factor of π. As shown in FIG. 5A, the sequence can be divided into three chirps (since q=3), each having a quadratic phase profile. The phase of the sequence wraps around three times and starts and ends at the same phase value. Unlike conventional CAZAC sequence generators that output a number of perfectly identical chirps, the different chirps generated by quadratic phase generator 50 are slightly distinct (e.g., each chirp exhibits a different respective magnitude response). A quadratic phase generator is thus defined as a circuit that is configured to output a signal having one or more chirps each having a quadratic phase response as shown in the example of FIG. 5A.

FIG. 5B is a diagram plotting the instantaneous frequency corresponding to the quadratic phase profile of FIG. 5A. In other words, the plot of FIG. 5B is obtained by differentiating or computing the derivative of the samples in FIG. 5A. As shown in FIG. 5B, the sequence is again divided into three chirps (since q=3), each chirp exhibiting a linear instantaneous frequency extending from around −π to approximately +π before wrapping around to −π. There is no frequency outliers between chirps.

FIG. 5C is a diagram plotting instantaneous frequency differences corresponding to the linear instantaneous frequency profile of FIG. 5B. Similarly, the plot of FIG. 5C is obtained by differentiating or computing the derivative of the samples in FIG. 5B. As shown in FIG. 5C, the instantaneous frequency differences can be two constant values: a higher value that is equal to the absolute value of q and a lower value that is equal to the absolute value of q minus M Thus, the difference between the higher value at the first input of the switch and the second value at the second input of the switch is proportional to word length M The instantaneous frequency difference only switches to the lower value when the sequence is wrapping around in between chirps (e.g., when wrapping around from the first chirp to the second chirp and from the second chirp to the third chirp). These two constant values may correspond to the values at the inputs of switch 98 (see FIG. 4).

The delta between the higher value and the lower value is equal to $2\pi$. The quadratic phase generator 50 described in connection with FIGS. 4, 5A, 5B, and 5C is therefore sometimes referred to as a "full-bandwidth" quadratic phase generator. A full-bandwidth quadratic phase generator that only needs to switch between two constant instantaneous frequency difference values is fairly straightforward to implement in hardware (see, e.g., the topology of FIG. 4) and therefore consumes a small amount of circuit area. The quadratic phase generator implementation of FIG. 4 also consumes less power and provides enhanced performance compared to conventional CAZAC sequence generators.

Figure 6:
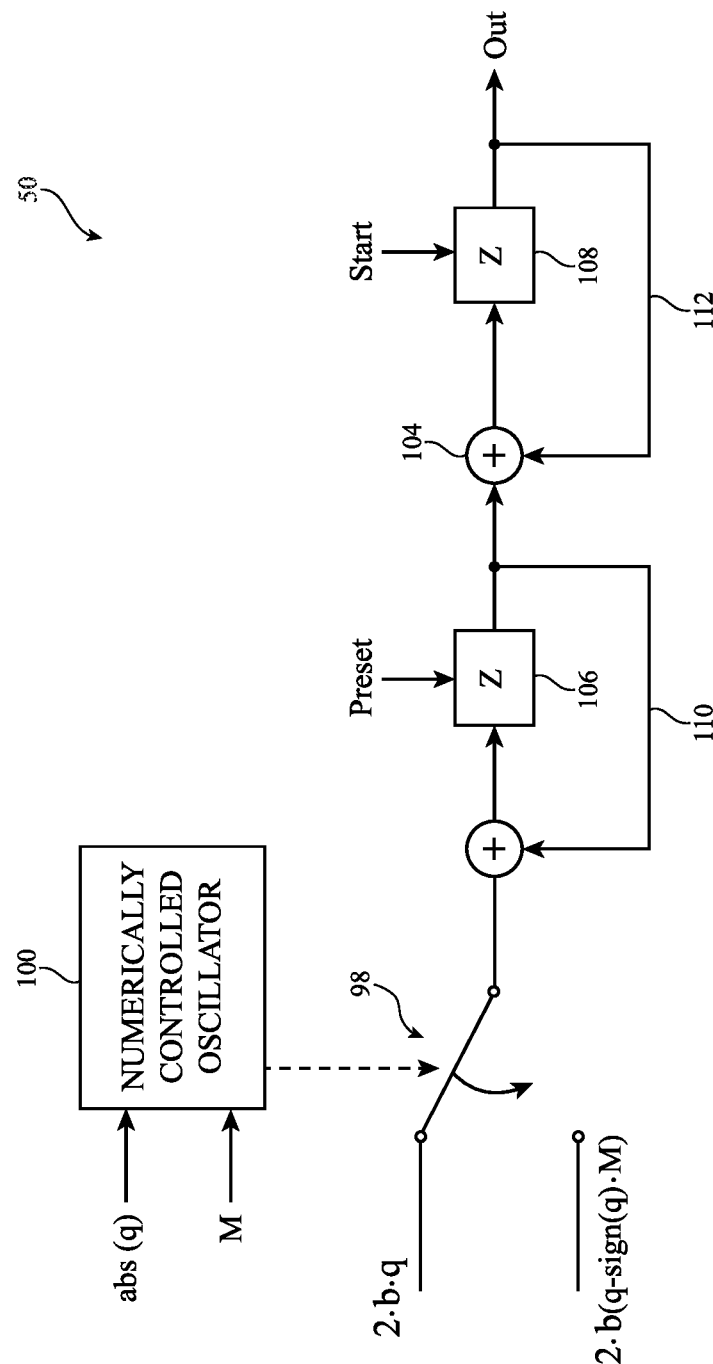
FIG. 6 is a block diagram of an illustrative band-limited quadratic phase generator in accordance with some embodiments.

The embodiment of FIGS. 4-5 relating to a full-bandwidth quadratic phase generator is merely illustrative. In other embodiments, it may be desirable to limit or reduce the operating bandwidth of quadratic phase generator 50. FIG. 6 illustrates another implementation of quadratic phase generator 50 having a limited bandwidth while also delivering an interpolated CAZAC sequence. To properly scale the bandwidth, a scaling (weighting) factor b may be applied to the two inputs of the NCO switch. In particular, the scaling factor b may be a fraction with a numerator value that weights both of the switch input values and a numerator value that scales the bit width of the summing circuits in the integrator (accumulator) stages.

As shown in FIG. 6, switch 98 may have a first switch input port configured to receive two times scaling factor b times the quantity of chirp count q minus the product of the sign of chirp count q and word length Mt. When numerically controlled oscillator 100 outputs an integrator value that is greater a threshold value, then switch 98 may connect the first switch input port to the switch output port (e.g., such that adder 102 receives 2*b*q). When numerically controlled oscillator 100 outputs an integrator value that is less than or equal to the threshold value, then switch 98 may connect the second switch input port to the switch output port (e.g., such that adder 102 receives 2*b*(q−sign(q)*M). The predetermined threshold value can be equal to M (as an example). The threshold value can be a fixed number or can be programmable. The remaining structure of quadratic phase generator 50 of FIG. 6 may be similar to that already described with respect to FIG. 4 and need not be reiterated in detail to avoid obscuring the present embodiment.

Configured as such, quadratic phase generator 50 of FIG. 6 is thus able to sum up during one symbol M samples with two instantaneous frequency increments as shown in equations 2 and 3 below:

$$\sum_{m=1}^{q} b*(q-M) + \sum_{m=q+1}^{M} b*q = 0 \quad (2)$$

$$\sum_{m=1}^{|q|} b*(q+M) + \sum_{m=|q|+1}^{M} b*q = 0 \quad (3)$$

Equation 2 represents an expression for the sum when q is positive, whereas question 3 represents an expression of the sum when q is negative. A weighted sum of zero in either scenario ensures that quadratic phase generator 50 produces minimal quantization error even with the band-limiting scaling factor b.

Figures 7A, 7B, 7C:
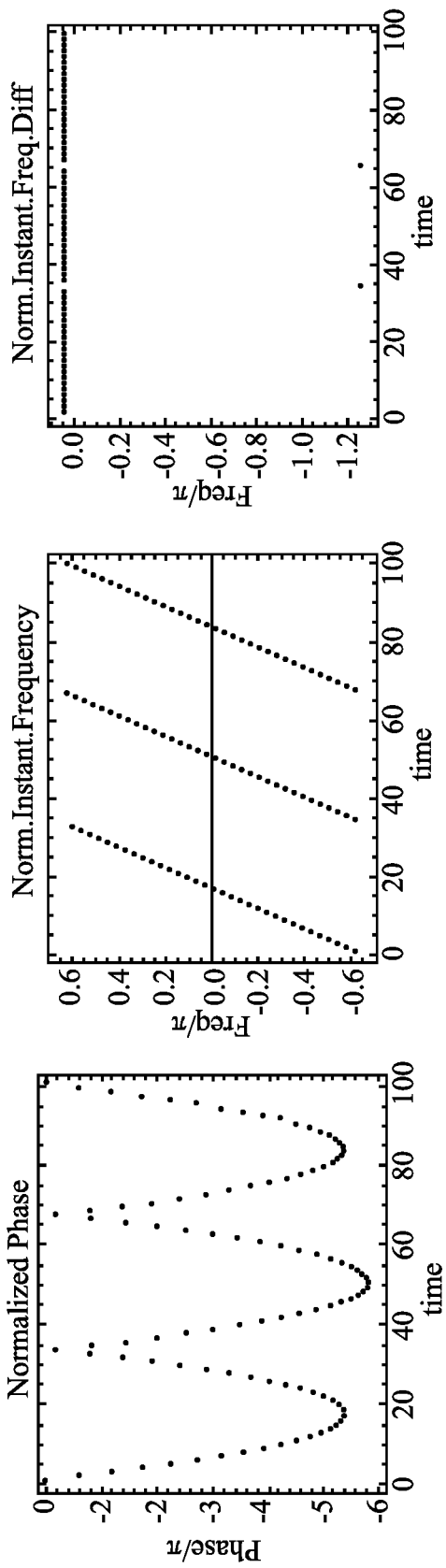
FIG. 7A is a diagram plotting output phase for the band-limited quadratic phase generator of FIG. 6 in accordance with some embodiments.
FIG. 7B is a diagram plotting instantaneous frequency for the band-limited quadratic phase generator of FIG. 6 in accordance with some embodiments.
FIG. 7C is a diagram plotting instantaneous frequency differences for the band-limited quadratic phase generator of FIG. 6 in accordance with some embodiments.

FIG. 7A is a diagram plotting the output phase for a quadratic phase generator 50 of the type described in connection with FIG. 6 for one sequence, where chirp count q is equal to 3 and where word length M is equal to 100. The output phase is normalized (i.e., divided) by a factor of re. As shown in FIG. 7A, the sequence can be divided into three chirps (since q=3), each having a quadratic phase profile. The phase of the sequence wraps around three times and starts and ends at the same phase value. Unlike conventional CAZAC sequence generators that output a number of perfectly identical chirps, the different chirps generated by quadratic phase generator 50 are again slightly distinct (e.g., each chirp is slightly shifted in its phase representation).

FIG. 7B is a diagram plotting the instantaneous frequency corresponding to the quadratic phase profile of FIG. 7A. In other words, the plot of FIG. 7B is obtained by differentiating the samples in FIG. 7A. As shown in FIG. 7B, the sequence is again divided into three chirps (since q=3), each chirp exhibiting a linear instantaneous frequency extending from around −0.625π to approximately +0.625π before wrapping back around. There are no frequency outliers between chirps.

FIG. 7C is a diagram plotting instantaneous frequency differences corresponding to the linear instantaneous frequency profile of FIG. 7B. Similarly, the plot of FIG. 7C is obtained by differentiating the samples in FIG. 7B. As shown in FIG. 7C, the instantaneous frequency differences can be two constant values: a higher value that is equal to the absolute value of q scaled by factor b and a lower value that is equal to the absolute value of q minus M, also scaled by factor b. The instantaneous frequency difference only switches to the lower value when the sequence is wrapping around in between chirps (e.g., when wrapping around from the first chirp to the second chirp and from the second chirp to the third chirp, etc.). These two constant values may correspond to the values at the inputs of switch 98 (see FIG. 6).

The delta between the higher value and the lower value may be equal to 1.25π in this particular example, which corresponds to a scaling factor b=1.25/2. In general, scaling factor b can be any fraction or value that is less than one. As examples, scaling factor b may be equal to 0.6, 0.7, 0.8, 0.6-0.7, 0.5-0.8, less than 0.99, less than 0.9, less than 0.8, less than 0.7, less than 0.6, less than 0.5, etc. The quadratic phase generator 50 described in connection with FIGS. 6, 7A, 7B, and 7C is therefore sometimes referred to as a "band-limited" or "reduced-bandwidth" quadratic phase generator. Such band-limited quadratic phase generator that only needs to switch between two constant instantaneous frequency difference values is fairly straightforward to implement in hardware (see, e.g., the topology of FIG. 6) and therefore consumes a small amount of circuit area. The reduced-bandwidth quadratic phase generator implementation of FIG. 6 generates an exact band-limited version of the full-bandwidth CAZAC sequence without any approximation.

Figure 8:
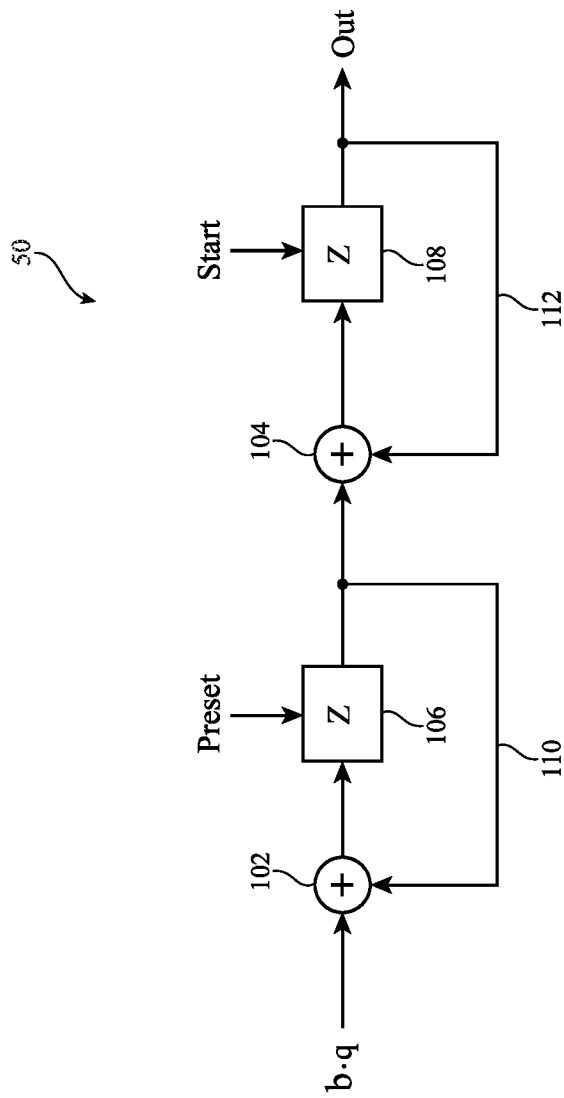
FIG. 8 is a block diagram of an illustrative quadratic phase generator without a numerically controlled oscillator in accordance with some embodiments.

The embodiment of FIG. 6 showing a reduced-bandwidth quadratic phase generator having a numerically controlled oscillator and an associated switch is merely illustrative. FIG. 8 shows another embodiment of a reduced-bandwidth quadratic phase generator 50 that does not include switch 98 and numerically controlled oscillator 100. Such type of quadratic phase generator 50 can be used when the following conditions are met:

$$|b*q - b*M| \in 2^{\wedge} M \quad (4)$$

$$|b*q + b*M| \in 2^{\wedge} M \quad (5)$$

Condition 4 is used for positive values of chirp count q, whereas condition 5 is used for negative values of chirp count q. If condition 4 or 5 is satisfied, then summing circuit 102 can always receive the product b*q, thereby obviating the need for a separate NCO integrator switch. This can help further minimize the circuit area of quadratic phase generator 50. Operated in this way, the wraparound of the integrator stages performs the desired subtraction function. The remaining structure of quadratic phase generator 50 of FIG. 8 may be similar to that already described with respect to FIG. 4 and need not be reiterated in detail to avoid obscuring the present embodiment.

Figure 9A:
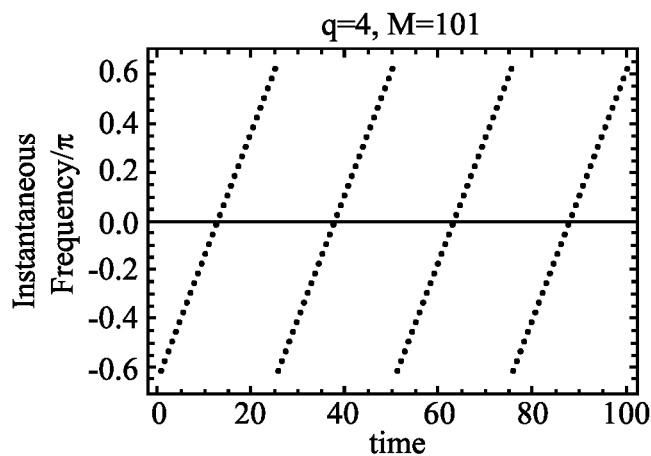
FIG. 9A is a diagram plotting instantaneous frequency for a quadratic phase generator with four chirps and a word length of 101 in accordance with some embodiments.
Figure 9B:
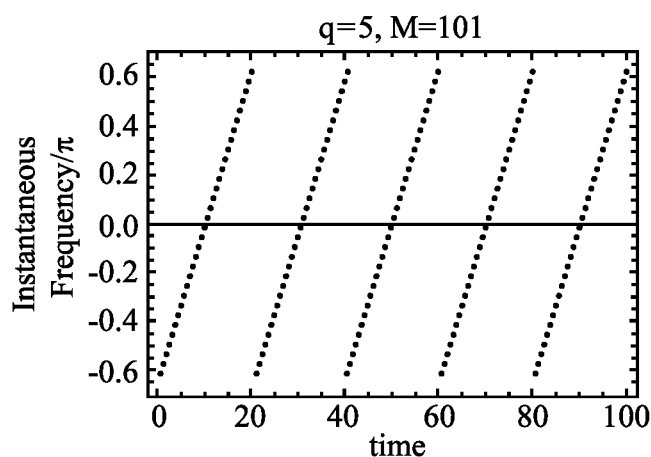
FIG. 9B is a diagram plotting instantaneous frequency for a quadratic phase generator with five chirps and a word length of 101 in accordance with some embodiments.
Figure 9C:
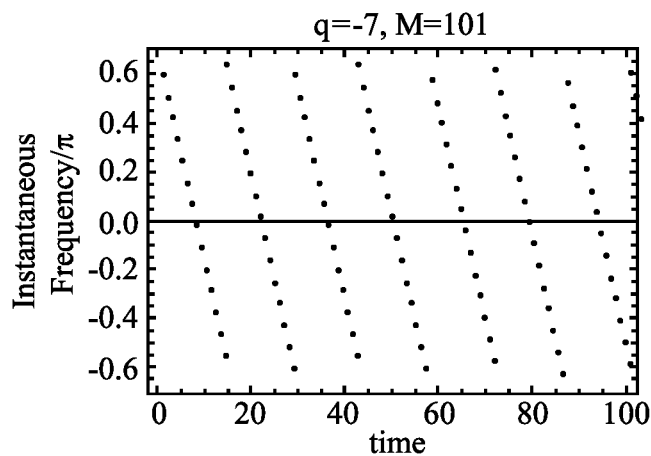
FIG. 9C is a diagram plotting instantaneous frequency for a quadratic phase generator with negative seven chirps and a word length of 101 in accordance with some embodiments.

As described above, the chirp count q can be any positive or negative integer. The only restriction on the value of word length M is that the greatest common divisor between q and M should be equal to one. FIGS. 9A-9C plot the instantaneous frequency for a band-limited quadratic phase generator 50 having different q and M values. FIG. 9A is a diagram plotting instantaneous frequency for a band-limited quadratic phase generator with four chirps (e.g., q=4) and a word length M of 101. The greatest common divisor of 4 and 101 is one. As shown in FIG. 9A, the sequence is divided into four chirps, each chirp exhibiting a slightly distinct linear instantaneous frequency response extending from around −0.625π to approximately +0.625π before wrapping back around. There are no frequency outliers between chirps.

FIG. 9B is a diagram plotting instantaneous frequency for a band-limited quadratic phase generator with five chirps (e.g., q=5) and a word length M of 101. The greatest common divisor of 5 and 101 is one. As shown in FIG. 9B, the sequence is divided into five chirps, each chirp exhibiting a slightly distinct linear instantaneous frequency response extending from around −0.625π to approximately +0.625π before wrapping back around. There are no frequency outliers between chirps.

The examples of FIGS. 9A and 9B having a positive chirp count value q is merely illustrative. FIG. 9C is a diagram plotting instantaneous frequency for a band-limited quadratic phase generator with seven chirps (e.g., q=−7) and a word length M of 101. The greatest common divisor of 7 and 101 is one. As shown in FIG. 9C, the sequence is divided into seven chirps, each chirp exhibiting a slightly distinct linear instantaneous frequency response extending from around −0.625π to approximately +0.625π before wrapping back around. There are no frequency outliers between successive chirps. Comparing FIG. 9C with FIGS. 9A and 9B, it is evident that a positive q produces an increasing linear instantaneous frequency response, whereas a negative q produces a decreasing linear instantaneous frequency response (e.g., the linear responses of FIGS. 9A and 9B exhibit an upward slope while the linear responses of FIG. 9C have a downward slope).

Figure 10A:
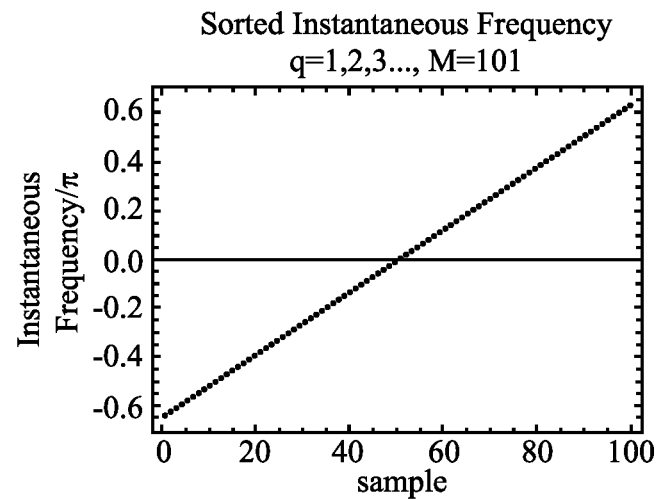
FIG. 10A is a diagram plotting the sorted instantaneous frequency for all chirp counts in accordance with some embodiments.

FIG. 10A is a diagram plotting the sorted instantaneous frequency for all chirp counts with a word length M of 101. In other words, sorting all the instantaneous frequency sample points from FIG. 9A will yield the sorted plot of FIG. 10A. Similarly, sorting all the instantaneous frequency sample points from FIG. 9B will likewise yield the sorted plot of FIG. 10A. Sorting all the instantaneous frequency sample points from FIG. 9C will similarly yield the sorted plot of FIG. 10A. In other words, the sorted instantaneous frequency samples output from a band-limited quadratic phase generator are independent of the magnitude of q.

Figure 10B:
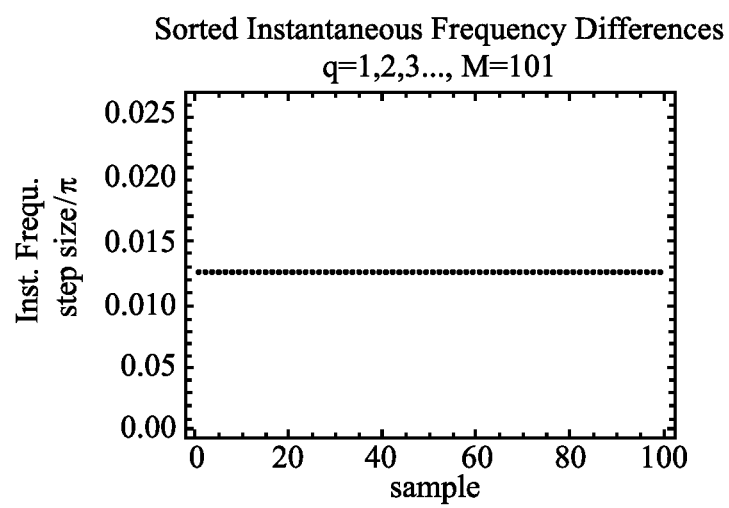
FIG. 10B is a diagram plotting the differences of the sorted instantaneous frequency for all chirp counts in accordance with some embodiments.

FIG. 10B is a diagram plotting the differences of the sorted instantaneous frequency again for all chirp counts. As shown in FIG. 10B, the frequency step size between samples is a constant value that is independent of the magnitude of q.

Figure 11:
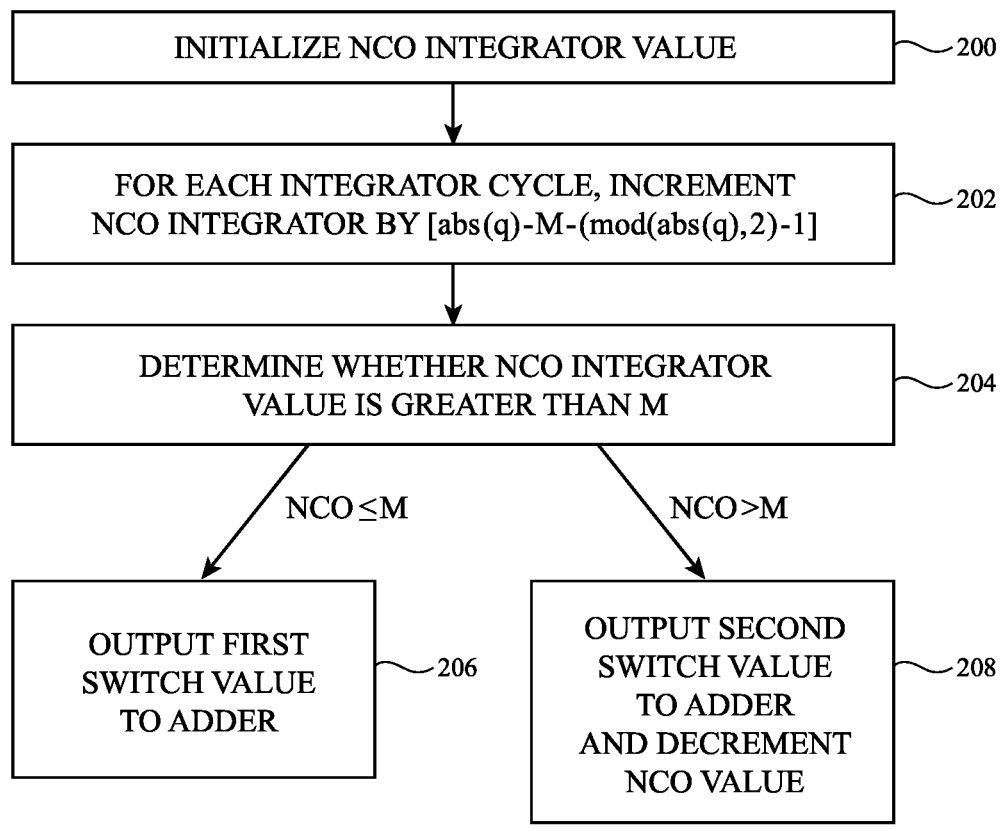
FIG. 11 is a flow chart of illustrative steps for operating a quadratic phase generator in accordance with some embodiments.

FIG. 11 is a flow chart of illustrative operations involved in controlling quadratic phase generator 50. At block 200, numerically controlled oscillator 100 may be initialized to some starting integrator value. At block 202, numerically controlled oscillator 100 may, during each integrator cycle, increment the integrator value by the absolute value of q minus word length M minus the difference between the modulus of the absolute value of (q, two) and one.

At block 204, numerically controlled oscillator 100 may determine whether the integrator value is greater than word length M. In response to determining that the present integrator value is less than or equal to M, then oscillator may direct the corresponding switch 98 to output the higher value at the first switch input to adder 102 (see operations of block 206). This value can then be accumulated by the first integrator stage, which can then be propagated to the second integrated stage after some delay.

In response to determining that the present integrator value is greater than M (e.g., if an integrator overflow event has been detected), then oscillator 100 may direct the corresponding switch 98 to output the lower value at the second switch input to adder 102 (see operations of block 208). This value can then be accumulated by the first integrator stage, which can then be propagated to the second integrated stage after some delay. The NCO value can then be decremented (e.g., by 2*M) to perform the wraparound.

The operations of FIG. 11 are merely illustrative. At least some of the described operations may be modified or omitted; some of the described operations may be performed in parallel; additional processes may be added or inserted between the described operations; the order of certain operations may be reversed or altered; the timing of the described operations may be adjusted so that they occur at slightly different times, or the described operations may be distributed in a system.

Figure 12:
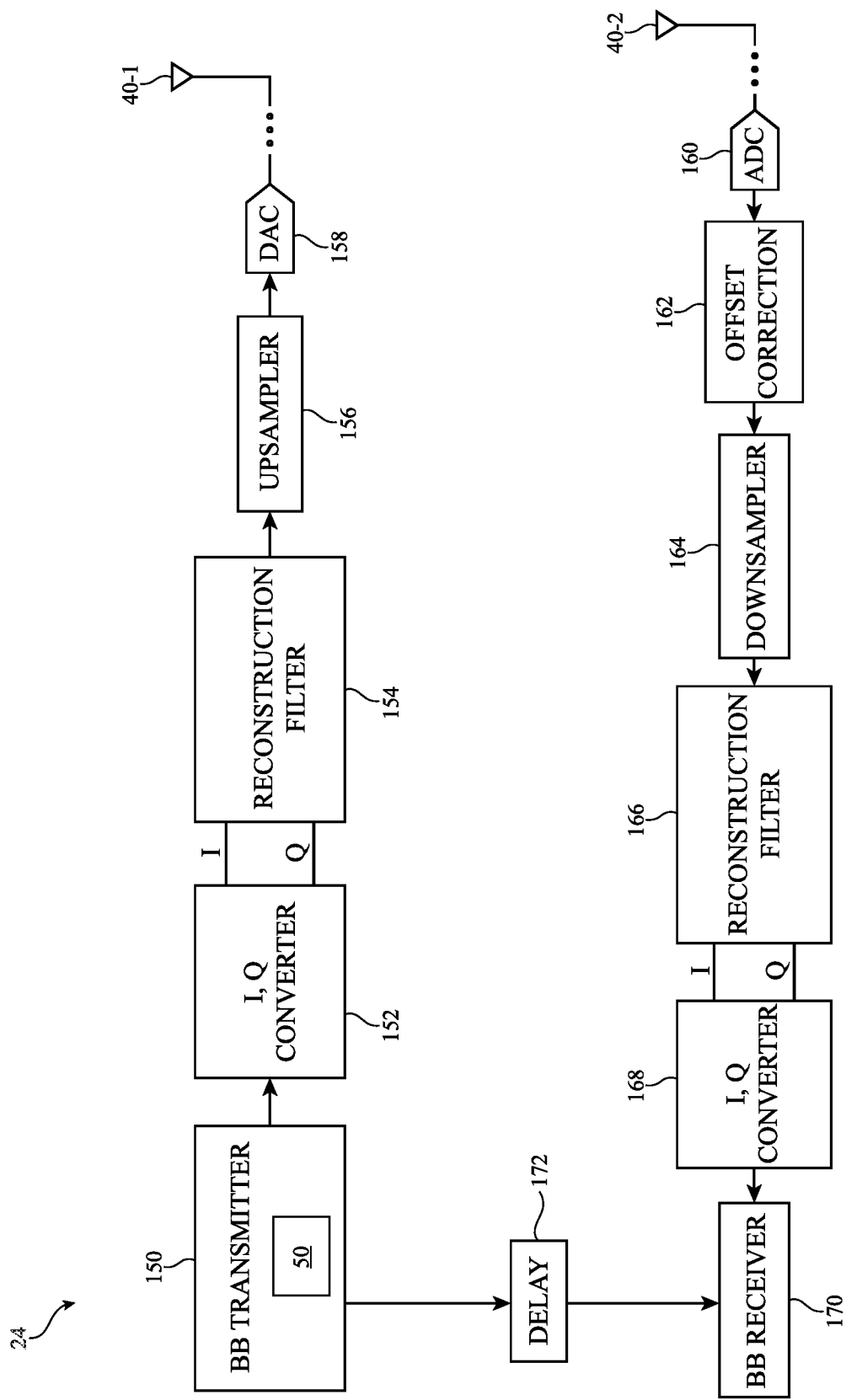
FIG. 12 is a diagram of wireless circuitry having channel filters configured with the same bandwidth as the quadratic phase generator in accordance with some embodiments.

FIG. 12 shows an example of wireless circuitry 24 implementing a frequency-modulated continuous-wave (FMCW) radar scheme that uses a quadratic phase generator 50. As shown in FIG. 12, wireless circuitry 24 may have a transmit path and a receive path. The transmit path may include a baseband (BB) transmitter such as baseband transmitter 150, an IQ conversion circuit such as IQ converter 152, a filtering circuit such as reconstruction filter 154, an upsampling circuit such as upsampler 156, a data converter such as digital-to-analog converter (DAC) 158, and transmit antenna 40-1. The baseband transmitter 150 may include a quadratic phase generator 50 (e.g., a full-bandwidth quadratic phase generator of the type shown in FIG. 4, a reduced-bandwidth quadratic phase generator of the type shown in FIG. 6, or a simplified quadratic phase generator of the type shown in FIG. 8) for outputting an interpolated CAZAC sequence to the IQ converter.

IQ converter 152 (sometimes referred to as an IQ modulator) may be configured to output corresponding in-phase (I) signals and quadrature (Q) signals. Reconstruction filter 154 may be interposed between IQ converter 150 and upsampler 156. In particular, reconstruction filter 154 can have the same bandwidth matching that of quadratic phase generator 50 and is sometimes referred to as a channel filter. In the scenario where quadratic phase generator 50 exhibits full bandwidth, filter 154 should have a bandwidth matching the full bandwidth of generator 50. In the scenario where quadratic phase generator 50 exhibits a reduced bandwidth, filter 154 should have relatively smaller bandwidth matching the smaller bandwidth of generator 50. Signals output from reconstruction filter 154 may be fed to digital-to-analog converter 158 via upsampling circuit 156. Upsampling circuit 156 may perform up-sampling or up-conversion operations. Digital-to-analog converter 158 may output a corresponding analog signal that can be fed to antenna 40-1 for transmission.

This example in which at least an IQ converter, a reconstruction filter, an upsampling circuit, and a digital-to-analog converter are included in the transmit path is merely illustrative. If desired, the transmit path may include additional digital components coupled to or inserted before DAC 30, fewer digital components, additional analog front-end components coupled to or inserted after DAC 30 (e.g., one or more bandpass filters, one or more power amplifiers, one or more mixers, etc.), fewer analog front-end components, and/or additional filter, switching, or coupling circuitry.

The receive path may include antenna 40-2, a data converter such as analog-to-digital converter 160, an offset correction circuit such as offset correction circuit 162, a downsampling circuit such as downsampler 164, a filtering circuit such as reconstruction filter 166, an IQ conversion circuit such as IQ converter 168, and a baseband receiver 170. This example in which wireless circuitry 24 performs spatial ranging operations by transmitting radio-frequency signals using a first antenna 40-1 and receiving corresponding reflected radio-frequency signals using a second different antenna 40-2 is merely illustrative. In other embodiments, the transmit and receive paths may be coupled to one or more of the same antennas 40.

Continuing with the example of FIG. 12, radio-frequency signals received by antenna 40-2 may be fed to analog-to-digital converter (ADC) 160 for conversion. ADC 160 may convert the analog radio-frequency signals into their digital equivalent. Offset correction circuit 162 may be interposed between ADC 1600 and downsampler 164. Offset correction circuit 162 may provide fine delay adjustment to help mitigate any potential offset or smearing that can occur prior to the downsampling operation. Downsampler 164 may perform down-sampling or down-conversion operations.

Reconstruction filter 166 may be interposed between downsampler 164 and IQ converter 168. In particular, reconstruction filter 166 can have the same bandwidth matching that of quadratic phase generator 50 and is also sometimes referred to as a channel filter. In the scenario where quadratic phase generator 50 exhibits full bandwidth, filter 166 should have a bandwidth matching the full bandwidth of generator 50. In the scenario where quadratic phase generator 50 exhibits a reduced or limited bandwidth, filter 154 should have relatively smaller bandwidth matching the limited bandwidth of generator 50. Signals output from reconstruction filter 166 may be fed to IQ converter 168. IQ converter 168 (sometimes referred to as an IQ demodulator) converts in-phase (I) and quadrature (Q) signals into baseband signals that can be received and processed by baseband receiver 170.

This example in which at least an IQ converter, a reconstruction filter, a downsampling circuit, an offset correction circuit (e.g., a delay adjustment circuit), and an analog-to-digital converter are included in the receive path is merely illustrative. If desired, the receive path may include additional analog front-end components coupled to or inserted before ADC 160 (e.g., additional filter, switching, or coupling circuitry), fewer analog front-end components, additional digital components coupled to or inserted after ADC 160, and/or fewer digital components.

A delay circuit 172 may be coupled between baseband transmitter 150 and baseband receiver 170. Delay circuit 172 may be configured to provide a fixed or adjustable delay amount to help compensate for any internal delay between the transmit and receive path. Delay circuit 172 can therefore sometimes be referred to as an internal delay compensation circuit. Baseband transmitter 150 and baseband receiver 170 are sometimes referred to collectively as a baseband processor that can be considered as being part of wireless circuitry 24 and processing circuitry 18 (see, e.g., FIG. 1).

The methods and operations described above in connection with FIGS. 1-12 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry 18 of FIG. 1, etc.). The processing circuitry may include microprocessors, central processing units (CPUs), application-specific integrated circuits with processing circuitry, or other processing circuitry. The components of FIGS. 2, 3, 4, 6, 8, and 12 may be implemented using hardware (e.g., circuit components, digital logic gates, etc.) and/or using software where applicable.

The foregoing is merely illustrative and various modifications can be made to the described embodiments. The foregoing embodiments may be implemented individually or in any combination.

What is claimed is:

1. Wireless circuitry comprising:
    at least one digital-to-analog converter having an input and an output that is coupled to an antenna; and
    a quadratic phase generator having
        an output port coupled to the input of the at least one digital-to-analog converter,
        a first integrator stage having an input and an output,
        a second integrator stage having an input coupled to the output of the first integrator stage and having an output connected to the output port, and
        a switch having a first input configured to receive a first value that is a function of a chirp count q that defines a number of chirps at the output port, a second input configured to receive a second value different than the first value, and an output that is coupled to the input of the first integrator stage.

2. The wireless circuitry of claim 1, wherein the first integrator stage comprises:
a first adder having a first input coupled to the output of the switch, a second input, and an output; and
a first delay circuit having an input coupled to the output of the first adder and having an output coupled to the second input of the first adder via a first feedback path.

3. The wireless circuitry of claim 2, wherein the second integrator stage comprises:
a second adder having a first input coupled to the output of the first delay circuit, a second input, and an output; and
a second delay circuit having an input coupled to the output of the second adder and having an output coupled to the second input of the second adder via a second feedback path.

4. The wireless circuitry of claim 3, wherein the first delay circuit is reset to a preset value, and wherein the second delay circuit is reset to a start value different than the preset value.

5. The wireless circuitry of claim 1, wherein:
the quadratic phase generator is configured to output an interpolated constant amplitude zero autocorrelation (CAZAC) sequence at the output port;
the chirp count q defines a number of chirps in the interpolated CAZAC sequence; and
the second value is a function of the chirp count q and a word length M that defines a number of samples in the interpolated CAZAC sequence.

6. The wireless circuitry of claim 5, wherein the quadratic phase generator further comprises:
a numerically controlled oscillator for controlling the switch, the switch being configured to
connect its first input to its output when a value output by the numerically controlled oscillator is less than or equal to a threshold value, and
connect its second input to its output when the value output by the numerically controlled oscillator is greater than the threshold value.

7. The wireless circuitry of claim 1, wherein:
the quadratic phase generator is configured to output an interpolated constant amplitude zero autocorrelation (CAZAC) sequence at the output port;
the first value is a function of: (1) the chirp count q that defines a number of chirps in the interpolated CAZAC sequence and (2) a scaling factor b for limiting a bandwidth of the quadratic phase generator; and
the second value is a function of: (1) the chirp count q, (2) the scaling factor b, and (3) a word length M that defines a number of samples in the interpolated CAZAC sequence.

8. The wireless circuitry of claim 1, wherein:
the quadratic phase generator is configured to output an interpolated constant amplitude zero autocorrelation (CAZAC) sequence at the output port;
the first value is a function of the chirp count q that defines a number of chirps in the interpolated CAZAC sequence;
the second value is a function of the chirp count q and a word length M that defines a number of samples in the interpolated CAZAC sequence; and a difference between the first value at the first input of the switch and the second value at the second input of the switch is proportional to the word length M.

9. The wireless circuitry of claim 1, wherein the quadratic phase generator is configured to output an interpolated constant amplitude zero autocorrelation (CAZAC) sequence at the output port and wherein the quadratic phase generator further comprises:
a numerically controlled oscillator coupled to the switch, the numerically controlled oscillator having a first input configured to receive the chirp count q that defines a number of chirps in the interpolated CAZAC sequence and to receive a word length M that defines a number of samples in the interpolated CAZAC sequence, the chirp count q being a positive or negative integer, and the chirp count q and the word length M having a greatest common divisor equal to one.

10. The wireless circuitry of claim 1, wherein:
the quadratic phase generator is configured to generate at the output port a sequence having a plurality of chirps; and
each chirp in the sequence has a quadratic phase response that is distinct from the other chirps in that sequence.

11. A method for operating wireless circuitry, the method comprising:
receiving digital signals at a digital-to-analog converter and converting the digital signals to analog signals for transmission via an antenna; and
outputting an interpolated constant amplitude zero autocorrelation (CAZAC) sequence from a quadratic phase generator, wherein the quadratic phase generator has an output port coupled to an input of the digital-to-analog converter, wherein the digital signals received at the digital-to-analog converter are generated based on the interpolated CAZAC sequence output from the quadratic phase generator and wherein outputting the interpolated CAZAC sequence from the quadratic phase generator includes
controlling a switch having a first input configured to receive a first value that is a function of a chirp count q that defines a number of chirps in the CAZAC sequence and having a second input configured to receive a second value different than the first value to selectively output the first value and the second value to a first integrator stage,
receiving signals from the first integrator stage at a second integrator stage, wherein the second integrator stage has an output connected to the output port of the quadratic phase generator, and
outputting the interpolated CAZAC sequence from the second integrator stage.

12. The method of claim 11, wherein outputting the interpolated CAZAC sequence from the quadratic phase generator further comprises:
receiving the first and second values at a first adder in the first integrator stage;
delaying signals output from the first adder; and
feeding the delayed signals back to the first adder.

13. The method of claim 12, wherein outputting the interpolated CAZAC sequence from the quadratic phase generator further comprises:
receiving the delayed signals at a second adder in the second integrator stage;
delaying signals output from the second adder; and
feeding the delayed signals output from the second adder back to the second adder.

14. The method of claim 11, wherein outputting the interpolated CAZAC sequence from the quadratic phase generator further comprises:
- controlling the switch based on a value output from a numerically controlled oscillator;
- periodically incrementing the value output from the numerically controlled oscillator; and
- determining whether the value output from the numerically controlled oscillator exceeds a threshold value.

15. The method of claim 14, wherein outputting the interpolated CAZAC sequence from the quadratic phase generator further comprises:
- in response to determining that the value output from the numerically controlled oscillator does not exceed the threshold value, controlling the switch to output the first value to the first integrator stage; and
- in response to determining that the value output from the numerically controlled oscillator exceeds the threshold value, controlling the switch to output the second value to the first integrator stage, wherein the second value is less than the first value.

16. The method of claim 15, wherein:
- the first value is proportional to a chirp count q that defines a number of chirps in the interpolated CAZAC sequence; and
- the second value is proportional to a difference between the chirp count q and a word length M that defines a total number of elements in the interpolated CAZAC sequence.

17. The method of claim 16, further comprising:
- reducing a bandwidth of the quadratic phase generator by multiplying the first value and the second value by a scaling factor that is less than one.

18. An electronic device comprising:
- a transmitter having a quadratic phase generator configured to output a constant amplitude zero autocorrelation (CAZAC) sequence, the quadratic phase generator having a first integrator stage, a second integrator stage coupled in series with the first integrator stage and having an output coupled to an output port of the quadratic phase generator, and a switch with a first input configured to receive a first value that is a function of a chirp count q that defines a number of chirps in the CAZAC sequence, a second input configured to receive a second value different than the first value, and an output that is coupled to an input of the first integrator stage;
- a digital-to-analog converter having an input coupled to the output port of the quadratic phase generator and configured to receive signals generated based on the CAZAC sequence and an output coupled to a first antenna;
- a first channel filter interposed between the transmitter and the input of the digital-to-analog converter, the first channel filter having the same bandwidth as the quadratic phase generator;
- an analog-to-digital converter having an input coupled to a second antenna and having an output on which digital signals are generated;
- a receiver having an input configured to receive signals generated based on the digital signals output from the analog-to-digital converter; and
- a second channel filter interposed between the output of the analog-to-digital converter and the input of the receiver, the second channel filter having the same bandwidth as the quadratic phase generator.

19. The electronic device of claim 18, further comprising:
- an offset correction circuit interposed between the output of the analog-to-digital converter and the second channel filter; and
- a delay compensation circuit coupled between the transmitter and the receiver.

* * * * *